United States Patent
Reilly et al.

(10) Patent No.: US 9,646,818 B2
(45) Date of Patent: May 9, 2017

(54) METHOD OF FORMING PLANAR CARBON LAYER BY APPLYING PLASMA POWER TO A COMBINATION OF HYDROCARBON PRECURSOR AND HYDROGEN-CONTAINING PRECURSOR

(71) Applicant: Applied Materials, Inc., Santa Clara, CA (US)

(72) Inventors: Patrick James Reilly, Pleasanton, CA (US); David Alan Bethke, Meridian, ID (US); Kwangduk Lee, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/077,545

(22) Filed: Mar. 22, 2016

(65) Prior Publication Data

US 2016/0284538 A1    Sep. 29, 2016

Related U.S. Application Data

(60) Provisional application No. 62/137,062, filed on Mar. 23, 2015.

(51) Int. Cl.
   *H01L 21/02*     (2006.01)
   *H01L 21/311*    (2006.01)
   *H01L 21/033*    (2006.01)

(52) U.S. Cl.
   CPC .. *H01L 21/02115* (2013.01); *H01L 21/02118* (2013.01); *H01L 21/02274* (2013.01);
   (Continued)

(58) Field of Classification Search
   CPC ......... H01L 21/02115; H01L 21/31111; H01L 21/02274; H01L 21/31133; H01L 21/02118
   See application file for complete search history.

(56) References Cited

U.S. PATENT DOCUMENTS 4,877,641 A    10/1989 Dory
5,567,661 A    10/1996 Nishio et al.
(Continued)

FOREIGN PATENT DOCUMENTS

| JP | 2007-224383 A | 9/2007 |
| KR | 10-2008-0102928 A | 11/2008 |
| KR | 10-2012-0121340 A | 11/2012 |

*Primary Examiner* — Michael Jung
(74) *Attorney, Agent, or Firm* — Kilpatrick Townsend & Stockton LLP (57) ABSTRACT

Aspects of the disclosure pertain to methods of forming planar amorphous carbon layers on patterned substrates. Layers formed according to embodiments outlined herein have may improve manufacturing yield by making the top surface of an amorphous carbon layer more planar despite underlying topography or stoichiometric variations. The amorphous carbon layers may comprise carbon and hydrogen, may consist of carbon and hydrogen or may comprise or consist of carbon, hydrogen and nitrogen in embodiments. Methods described herein may comprise introducing a hydrogen-containing precursor at a relatively high ratio relative to a hydrocarbon into a substrate processing region and concurrently applying a local plasma power capacitively to the substrate processing region to form the planar layer. Alternatively an atomic flow ratio of hydrogen:carbon may begin low and increase discretely or smoothly during formation of the amorphous carbon layer.

14 Claims, 5 Drawing Sheets

(52) U.S. Cl.
CPC ...... *H01L 21/0332* (2013.01); *H01L 21/0337* (2013.01); *H01L 21/31111* (2013.01); *H01L 21/31133* (2013.01)

(56) References Cited

U.S. PATENT DOCUMENTS

| | | | |
|---|---|---|---|
| 6,835,663 B2 | 12/2004 | Lipinski | |
| 6,900,002 B1 | 5/2005 | Plat | |
| 7,079,740 B2 | 7/2006 | Vandroux et al. | |
| 7,125,758 B2 | 10/2006 | Choi et al. | |
| 7,501,355 B2 | 3/2009 | Bhatia et al. | |
| 7,638,440 B2 | 12/2009 | Wang et al. | |
| 7,754,294 B2 | 7/2010 | Choi et al. | |
| 7,785,672 B2 | 8/2010 | Choi et al. | |
| 7,790,635 B2 | 9/2010 | Balseanu et al. | |
| 7,884,035 B2 | 2/2011 | Park et al. | |
| 8,074,599 B2 | 12/2011 | Choi et al. | |
| 8,083,853 B2 | 12/2011 | Choi et al. | |
| 8,328,939 B2 | 12/2012 | Choi et al. | |
| 8,435,608 B1 * | 5/2013 | Subramonium | C23C 16/045 427/569 |
| 8,536,065 B2 | 9/2013 | Seamons et al. | |
| 8,993,454 B2 | 3/2015 | Seamons et al. | |
| 2004/0000534 A1 | 1/2004 | Lipinski | |
| 2005/0199013 A1 | 9/2005 | Vandroux et al. | |
| 2005/0199585 A1 | 9/2005 | Wang et al. | |
| 2005/0202683 A1 | 9/2005 | Wang et al. | |
| 2006/0005771 A1 | 1/2006 | White et al. | |
| 2006/0105106 A1 | 5/2006 | Balseanu et al. | |
| 2006/0269693 A1 | 11/2006 | Balseanu et al. | |
| 2008/0268175 A1 | 10/2008 | Park et al. | |
| 2009/0075490 A1 | 3/2009 | Dussarrat | |
| 2009/0255759 A1 | 10/2009 | Barnes | |
| 2010/0093187 A1 | 4/2010 | Lee et al. | |
| 2010/0099236 A1 | 4/2010 | Kwon et al. | |
| 2010/0291713 A1 | 11/2010 | Lee et al. | |
| 2011/0095402 A1 | 4/2011 | Park et al. | |
| 2011/0223774 A1 | 9/2011 | Kweskin et al. | |
| 2011/0244142 A1 | 10/2011 | Cheng et al. | |
| 2011/0287633 A1 * | 11/2011 | Lee | C23C 16/26 438/725 |
| 2012/0080779 A1 | 4/2012 | Seamons et al. | |
| 2013/0183835 A1 | 7/2013 | Nguyen et al. | |
| 2013/0302996 A1 * | 11/2013 | Reilly | C23C 16/26 438/758 |
| 2014/0017897 A1 | 1/2014 | Seamons et al. | |
| 2014/0094035 A1 * | 4/2014 | Ji | H01L 21/02115 438/703 |
| 2014/0370711 A1 | 12/2014 | Cheng et al. | |
| 2015/0093908 A1 * | 4/2015 | Reddy | H01L 21/0332 438/758 |
| 2015/0194317 A1 | 7/2015 | Manna et al. | |
| 2016/0086794 A9 | 3/2016 | Cheng et al. | |
| 2016/0225588 A1 * | 8/2016 | Shaikh | H01J 37/32449 |

\* cited by examiner

METHOD OF FORMING PLANAR CARBON LAYER BY APPLYING PLASMA POWER TO A COMBINATION OF HYDROCARBON PRECURSOR AND HYDROGEN-CONTAINING PRECURSOR

CROSS-REFERENCES TO RELATED APPLICATIONS

This application claims the benefit of U.S. Prov. Pat. App. No. 62/137,062 filed Mar. 23, 2015, and titled "DEFECT PLANARIZATION" by Reilly et al., which is hereby incorporated herein in its entirety by reference for all purposes.

FIELD

The subject matter herein relates to forming planar amorphous carbon layers on patterned substrates.

BACKGROUND

Alternative hardmask materials have been developed to assist in transferring patterns from photoresist to underlying layers. Typically, the hardmask may be metal, silicon oxide or silicon nitride. However, some device structures already include metal, silicon oxide and/or silicon nitride layers to be patterned. It may not be desirable to pattern such device structures using a metal, silicon oxide or silicon nitride hardmask, since there may be little or no etch selectivity between the hardmask and the material to be etched. The process of removing the hardmask could also remove or damage underlying layers. A successful etch mask material ought to have etch selectivity relative to metal layers, silicon oxide layers and silicon nitride layers. Amorphous hydrogenated carbon is one such material which has been used as a hardmask for metals, silicon oxide or silicon nitride. Amorphous hydrogenated carbon, also referred to as amorphous carbon and denoted a-C:H, is essentially a carbon material with no long-range crystalline order. It is desirable to use a gas-phase deposition technique to produce amorphous carbon layers. Plasma enhanced chemical vapor deposition (PECVD) has been used to form amorphous carbon layers as an alternative to traditional techniques. In a typical PECVD process, a hydrocarbon source, such as a gas-phase hydrocarbon or vapors of a liquid-phase hydrocarbon that have been flowed with a carrier gas into a PECVD chamber. Plasma is then initiated in the chamber to form an amorphous carbon layer on the substrate. Amorphous carbon may form defects on patterned substrates which relate to a lack of planar post-deposition surface.

Techniques are needed for forming planar amorphous carbon layers to help avoid non-planar defect related yield loss.

SUMMARY

Aspects of the disclosure pertain to methods of forming planar amorphous carbon layers on patterned substrates. Layers formed according to embodiments outlined herein have may improve manufacturing yield by making the top surface of an amorphous carbon layer more planar despite underlying topography or stoichiometric variations. The amorphous carbon layers may comprise carbon and hydrogen, may consist of carbon and hydrogen or may comprise or consist of carbon, hydrogen and nitrogen in embodiments. Methods described herein may comprise introducing a hydrogen-containing precursor at a relatively high ratio relative to a hydrocarbon into a substrate processing region and concurrently applying a local plasma power capacitively to the substrate processing region to form the planar layer. Alternatively an atomic flow ratio of hydrogen:carbon may begin low and increase discretely or smoothly during formation of the amorphous carbon layer.

Embodiments disclosed herein include methods of forming a carbon layer on a patterned substrate. The methods include placing the patterned substrate in a substrate processing region of a substrate processing chamber. The methods further include flowing a hydrogen-containing precursor into the substrate processing region. The methods further include flowing a hydrocarbon precursor into the substrate processing region. The methods further include applying plasma power to the substrate processing region. The methods further include forming a plasma from a combination of the hydrogen-containing precursor and the hydrocarbon precursor in the substrate processing region. The hydrogen-containing precursor includes hydrogen. The methods further include maintaining a first atomic flow rate ratio (H:C) between zero and two. The methods further include forming a first portion of a carbon layer having a first top interface. The methods further include increasing an atomic flow rate ratio from the first atomic flow rate ratio to a second atomic flow rate ratio (H:C) greater than two. The methods further include maintaining the second atomic flow rate ratio. The methods further include forming a second portion of the carbon layer having a second top interface.

The second atomic flow rate ratio (H:C) may be greater than three. The second top interface may be more planar than the first top interface. Forming the plasma may include applying an RF power capacitively. The hydrogen-containing precursor may further include nitrogen. Forming the plasma may include applying an RF power at a frequency greater than 100 kHz.

Embodiments disclosed herein include methods of forming a planar carbon layer on a patterned substrate. The methods include placing the patterned substrate in a substrate processing region of a substrate processing chamber. The methods further include flowing a hydrogen-containing precursor into the substrate processing region. The methods further include flowing a hydrocarbon precursor into the substrate processing region. The hydrocarbon precursor includes carbon and hydrogen. The methods further include forming a precursor combination of the hydrogen-containing precursor and the hydrocarbon precursor in the substrate processing region. The methods further include applying plasma power to the precursor combination in the substrate processing region. The methods further include forming a first carbon layer having a first top interface. The methods further include smoothly increasing an atomic flow rate ratio from a first atomic flow rate ratio below two to a second atomic flow rate ratio above three (H:C). The methods further include forming a second carbon layer having a second top interface. The planar carbon layer includes the first carbon layer and the second carbon layer.

The hydrogen-containing precursor and the hydrocarbon precursor may be flowed into the substrate processing region at an atomic flow rate ratio (H:C) of between three and seven. The hydrogen-containing precursor may include one or more of $H_2$, $NH_3$, $N_2H_4$ and $N_2H_2$. The hydrogen-containing precursor may consist of hydrogen. The hydrogen-containing precursor may consist of hydrogen and nitrogen. The hydrocarbon precursor may include only carbon and hydrogen.

Embodiments disclosed herein include methods of forming a planar carbon layer on a patterned substrate. The methods include placing the patterned substrate in a substrate processing region of a substrate processing chamber. The methods further include flowing a hydrogen-containing precursor into the substrate processing region and combining the hydrogen-containing precursor with a hydrocarbon precursor. The methods further include forming a plasma from the combination of the hydrogen-containing precursor and the hydrocarbon precursor by applying plasma power to the substrate processing region. The methods further include forming the planar carbon layer. The planar carbon layer includes carbon and hydrogen.

The hydrogen-containing precursor and the hydrocarbon precursor may be flowed into the substrate processing region at an atomic flow rate ratio (H:C) of greater than three. The planar carbon layer may be amorphous. The planar carbon layer may include only hydrogen and carbon. Forming the planar carbon layer may further include concurrent etching of high points faster than low points during formation of the planar carbon layer.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Aspects of the disclosure pertain to methods of forming planar amorphous carbon layers on patterned substrates. Layers formed according to embodiments outlined herein have may improve manufacturing yield by making the top surface of an amorphous carbon layer more planar despite underlying topography or stoichiometric variations. The amorphous carbon layers may comprise carbon and hydrogen, may consist of carbon and hydrogen or may comprise or consist of carbon, hydrogen and nitrogen in embodiments. Methods described herein may comprise introducing a hydrogen-containing precursor at a relatively high ratio relative to a hydrocarbon into a substrate processing region and concurrently applying a local plasma power capacitively to the substrate processing region to form the planar layer. Alternatively an atomic flow ratio of hydrogen:carbon may begin low and increase discretely or smoothly during formation of the amorphous carbon layer.

The amorphous layers described herein are formed on patterned substrate which may have a height differential between two portions of a repeated cell which will become an integrated circuit. Instead of or in addition to the height differential, the patterned substrate may have a divot or a bump or any other deviation from planarity according to embodiments. Alternatively, or in combination, the two portions may be composed of differing elements or materials and/or may have differing stoichiometries of the same elements. Regardless of the type of incongruity, PECVD formations of amorphous carbon may exhibit growth anomalies which form crevasses in the amorphous carbon layer grown according to prior art practices. The methods described herein may involve growing a portion of an amorphous carbon layer according to prior art practices and then another portion on top using higher hydrogen:carbon atomic flow ratios which may involve a higher hydrogen:hydrocarbon flow ratio to even the deposition out. In such a case, a "defect" is formed but then nullified by the further deposition so yield may be unaffected in embodiments. The increased hydrogen content is thought to introduce an etch component which preferentially etches high spots relative to low spots while amorphous carbon layer formation continues. In an alternative embodiment, the amorphous carbon layer is deposited with high hydrogen:hydrocarbon flow ratio throughout the formation of the amorphous carbon layer.

To facilitate the description of features on patterned substrates, "top" and "up" will be used herein to describe portions/directions perpendicularly distal from the substrate plane and further away from the center of mass of the substrate in the perpendicular direction. "Vertical" will be used to describe items aligned in the "up" direction towards the "top". "Depth" will be used to describe lengths in the vertical direction and "width" will be used to describe lengths parallel to the substrate plane. The methods described herein may avoid the problem of depositing more material away from a break in type of material and/or height differential on the underlying patterned substrate. Therefore, a benefit of the embodiments described herein involve formation of a planar layer of, e.g. hardmask, material and a concomitant increase in manufacturing yield. A further benefit of the embodiments described herein involve a reduced cost rather than introducing more complex hardware and materials to form a planar layer. A further benefit is the avoidance of using chemical mechanical polishing which would also increase costs and apply restrictions on the choice of planarizing material.

Figure 1:
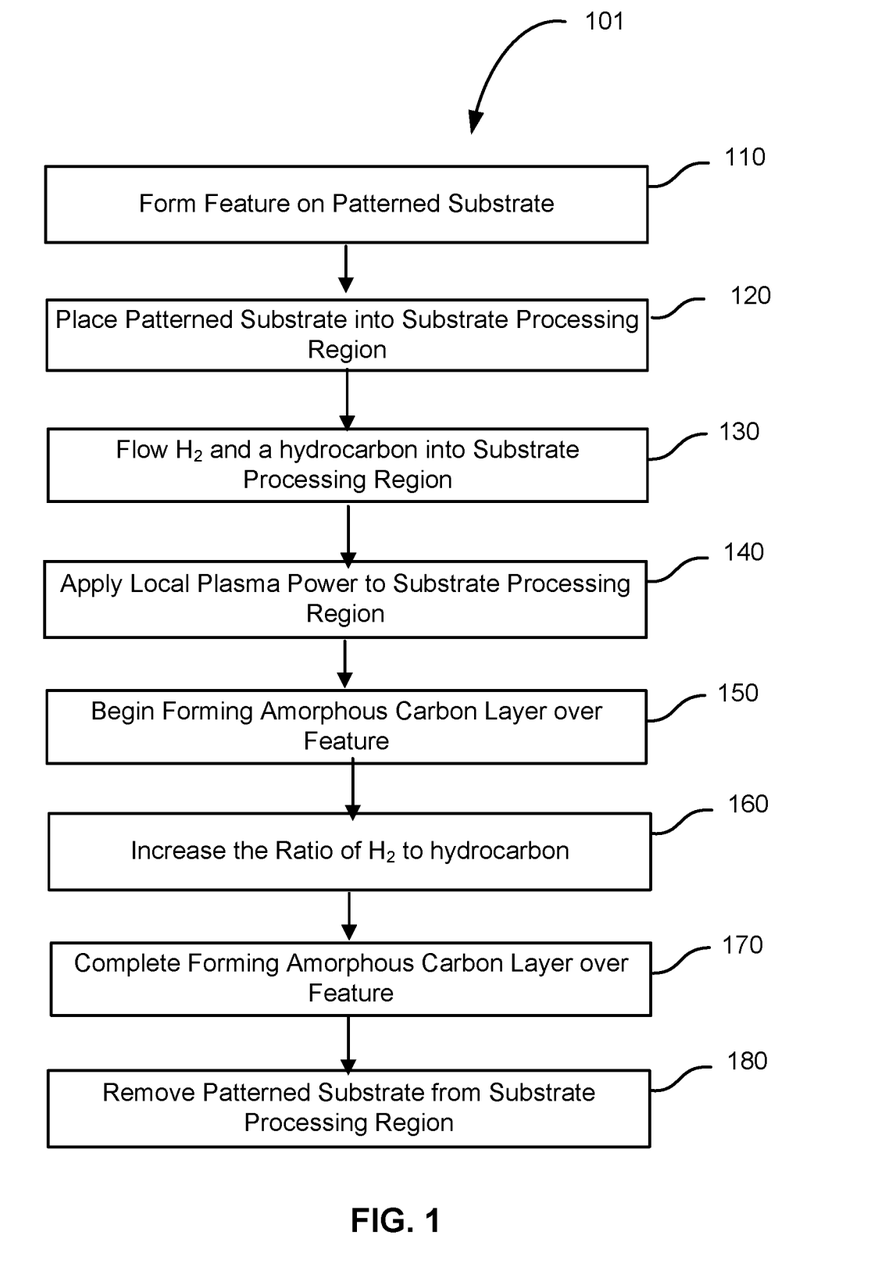
FIG. 1 is a flow chart of a planar layer formation process according to embodiments.

To better understand and appreciate the embodiments described herein, reference is made to FIG. 1, which is a flowchart of a planar layer formation process 101 according to embodiments. Reference will concurrently be made to FIGS. 2A, 2B and 2C, which are cross-sectional schematic views of a device during planar layer formation process 101. The method begins by forming a patterned substrate 201 which has a height differential between at least two portions of patterned substrate 201 in operation 110. In embodiments, patterned substrate 201 may have more than one exposed material so there exist transitions between at least two exposed materials which may be referred to as a "break" in type of exposed material. Height differentials and multiple exposed materials may be present on the same substrate according to embodiments. The patterned substrate is placed in a substrate processing region of a substrate processing chamber in operation 120.

Figure 2A:
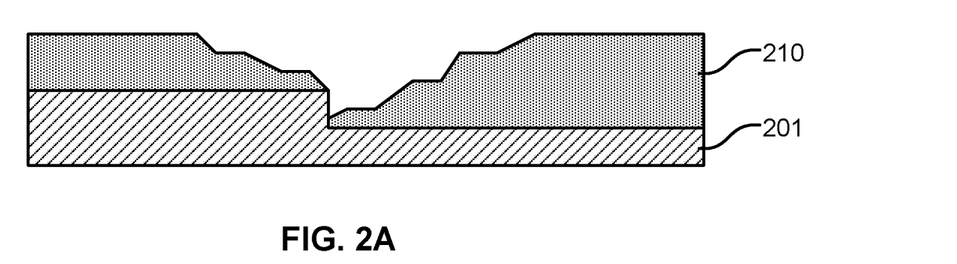
FIG. 2A is a cross-sectional schematic view of a device prior to forming a planar layer according to embodiments.

A hydrogen-containing precursor (e.g. $H_2$) and a hydrocarbon precursor (e.g. $C_2H_2$) are flowed into the substrate processing region in operation 130. A plasma is formed (operation 140) in the substrate processing region using parallel plates and the plasma is referred to as a capacitively-coupled plasma. An inductively-coupled plasma may be used according to embodiments. The flow rate ratio of hydrogen-containing precursor to hydrocarbon precursor is maintained at a first flow rate ratio while an amorphous carbon layer begins forming on patterned substrate 201. The precursor(s) may flow without interruption into the substrate processing region during application of plasma power. FIG. 2A shows patterned substrate 201 after a first portion of amorphous carbon layer 210 is formed in operation 150.

Figure 2B:
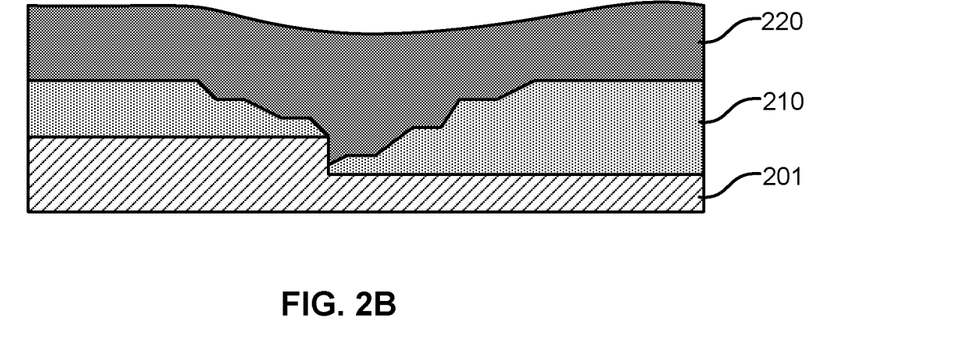
FIG. 2B is a cross-sectional schematic view of a device after forming a planar layer according to embodiments.

The flow rate ratio of hydrogen-containing precursor to hydrocarbon precursor is increased from the first flow rate ratio to a second flow rate ratio in operation 160. The second flow rate ratio is greater than the first flow rate ratio. The formation of amorphous carbon is continued in operation 170 to form a second portion of amorphous carbon layer 220. Patterned substrate 201, first portion of amorphous carbon layer 210 and second portion of amorphous carbon layer 220 are shown in FIG. 2B. Patterned substrate 201 is removed from the substrate processing region in operation 180.

Figure 2C:
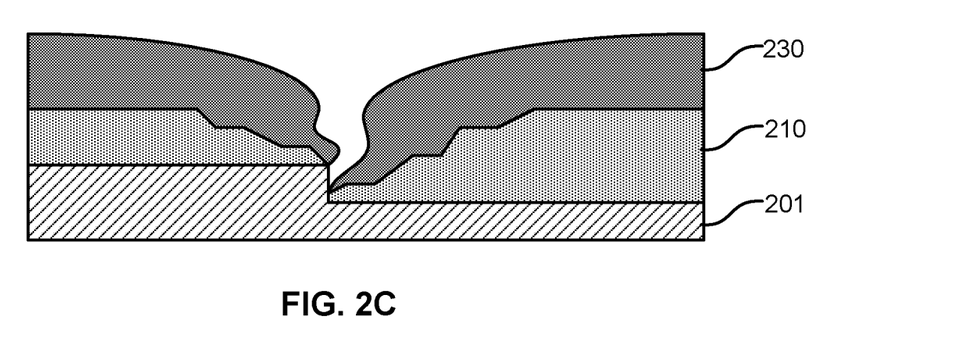
FIG. 2C is a cross-sectional schematic view of a device without the benefits of forming a planar layer according to embodiments.

The operation of forming the second portion of amorphous carbon layer 220 (operation 170) not only deposits additional amorphous carbon material but may concurrently and preferentially remove amorphous carbon material located at high points above patterned substrate 201. FIG. 2C shows patterned substrate 201 if the H:C flow ratio were not changed in operation 160. If the flow ratio of the hydrogen-containing precursor to the hydrocarbon precursor is not changed during planar layer formation process 101, second portion of amorphous carbon layer 230 may accentuate the lack of planarity already present on first portion of amorphous carbon layer 210. The manufacturing yield would be negatively impacted and a benefit of the methods described herein include improving the manufacturing yield of integrated circuit devices.

The hydrogen-containing precursor may be one or more of $H_2$, $NH_3$, $N_2H_4$ or $N_2H_2$ according to embodiments. The hydrogen-containing precursor may consist of hydrogen in embodiments. The hydrogen-containing precursor may comprise or consist of hydrogen and nitrogen according to embodiments. The hydrocarbon precursor may be one or more of $C_2H_2$, $C_2H_4$, $C_3H_6$ or $C_3H_4$ (any of several isomers) in embodiments. The hydrocarbon precursor comprises hydrogen and carbon and may consist of hydrogen and carbon according to embodiments. The hydrocarbon precursor may comprise between one and four carbon atoms in embodiments. These choices of precursors and all the other process parameters described herein apply to all the embodiments described herein and may not be repeated each time for the sake of brevity.

The first flow rate ratio of hydrogen-containing precursor to hydrocarbon precursor may be between zero and three, zero and two or zero and one according to embodiments. The second flow rate ratio (using volumetric units e.g. sccm's) may be greater than two, greater than three, greater than four, greater than six, greater than eight, between two and eight, between three and seven or between four and six in embodiments. The flow rate ratio may also be expressed as an atomic flow rate ratio to compensate for the varying amount of carbon atoms in the hydrocarbon precursor and variable number of hydrogen atoms in the hydrogen-containing precursor. A first atomic flow rate ratio (H:C during operation 150) may be between zero and three, zero and two or zero and one according to embodiments. A second atomic flow rate ratio (H:C during operation 170) may be greater than two, greater than three, greater than four, greater than six, greater than eight, between two and eight, between three and seven or between four and six in embodiments. For the sake of brevity all ratios provided herein may be used for either a volumetric ratio (such as sccm's) or an atomic flow rate ratio. Raising the hydrogen-containing precursor too high relative to the hydrocarbon precursor may result in the etch portion of the process dominating the deposition portion of the process.

The ratio of hydrogen-containing precursor to hydrocarbon precursor (or H:C when counting atomically) may be increased discretely which would result in the sharp interface represented in FIG. 2B. The ratio may also be smoothly increased from a first atomic flow rate to a second atomic flow rate ratio during a portion of the film growth process. The numbers for atomic flow ratios given above may be applied to a smoothly increased atomic flow rate ratio method and the first atomic flow ratio may be the starting point whereas the second atomic flow rate ratio may be the ending point. The starting and ending points may be at the beginning and ending points of film formation in embodiments. In this case the sharp interface between first portion of amorphous carbon layer 210 and second portion of amorphous carbon layer 220 would not exist in embodiments. The ratio of H:C may be increased from a first atomic flow rate ratio below two to a second atomic flow rate ratio above two according to embodiments. The ratio of H:C may be increased from a first atomic flow rate ratio below two to a second atomic flow rate ratio above four in embodiments. Lastly, the ratio of H:C may be increased from a first atomic flow rate ratio below two to a second atomic flow rate ratio above six according to embodiments. The atomic flow ratio embodiments just described may be applied to both the smoothly and discretely varying embodiments.

Figure 3:
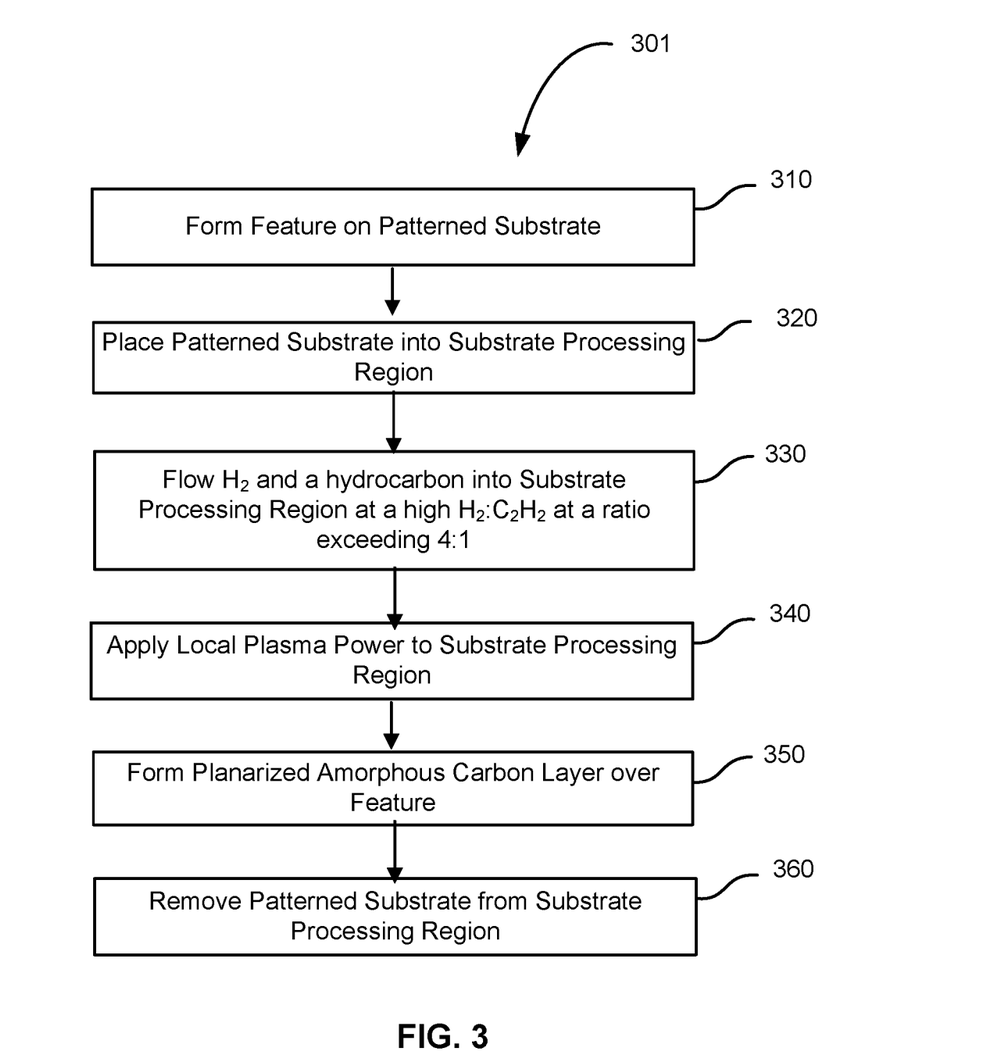
FIG. 3 is a flow chart of a planar layer formation process according to embodiments.

Reference is now made to FIG. 3, which is a flowchart of a planar layer formation process 301 according to embodiments. The method begins by forming a patterned substrate which has a height differential between at least two portions of a patterned substrate in operation 310. In embodiments, the patterned substrate may have more than one exposed material so there exist transitions between at least two exposed materials as before. The patterned substrate is placed in a substrate processing region of a substrate processing chamber in operation 320. A hydrogen-containing precursor (e.g. $H_2$) and a hydrocarbon precursor (e.g. $C_2H_2$) are flowed into the substrate processing region with an atomic flow ratio of more than 4:1 H:C in operation 330. A plasma is formed (operation 340) in the substrate processing region as before. An amorphous carbon layer forms on the patterned substrate (operation 350). The flow rate ratio of hydrogen-containing precursor to hydrocarbon precursor (or H:C atomically counted) may be above 2:1, above 3:1, above 4:1, above 6:1 or above 8:1 according to embodiments. An atomic flow rate ratio (H:C) may also be between two and eight, between three and seven or between four and six in embodiments. The deposition rate of the amorphous carbon layer may be somewhat less than in planar layer formation process 101 since the etch component may be elevated throughout planar layer formation process 301. Patterned substrate 201 is removed from the substrate processing region in operation 360. The amorphous carbon layer formed in planar layer formation process 301 may again exhibit a more planar top interface than prior art techniques and provide the benefit of an increased manufacturing yield of integrated circuit devices.

During formation of the planar layers described herein (e.g. operations 150-170 or operation 350), a temperature of the patterned substrate may be between 100° C. and about 800° C., between 200° C. and 700° C. or between 300° C. and 550° C. according to embodiments. During formation, the pressure in the substrate processing region of the substrate processing chamber may be between 100 mTorr and 100 Torr, between 1 Torr and 20 Torr or between 2 Torr and 12 Torr. The plasma may be created by applying RF power to a showerhead electrode and a substrate support electrode of the chamber. The RF power may be provided at a frequency greater than 100 kHz, greater than 1 MHz, or greater than 10 MHz in embodiments. The RF power may be provided at a frequency of between 100 kHz and 1 MHz, between 200 kHz and 750 kHz, between 300 kHz and 400 kHz, or between 13 and 14 MHz according to embodiments. The RF power may be provided at a mixed frequency including a first frequency between 100 kHz and 1 MHz, between 300 kHz and 400 kHz and a second frequency of between 1 MHz and 60 MHz or between 13 and 14 MHz. The plasma power may be between 50 watts and 1600 watts in embodiments.

Either or both precursors (the hydrogen-containing precursor or the hydrocarbon precursor) may be accompanied by or combined with inert gases to improve ease of striking a plasma or other plasma qualities. The inert gases may include He, Ar and/or $N_2$. The hydrocarbon precursor may be flowed at between 25 sccm (standard cubic centimeter per minute) and 5 slm (standard liter per minute) between 50 sccm and 300 sccm or between 100 sccm and 200 sccm in embodiments. The hydrogen-containing precursor may be flowed at between 100 sccm and 8.5 slm, between 200 sccm and 5 slm or between 500 sccm and 1.5 slm according to embodiments. Helium may be flowed at between 1 slm and 10.0 slm and $N_2$ may be flowed at between 500 sccm and 5 slm. Flow rate ratios were provided earlier.

Figure 4:
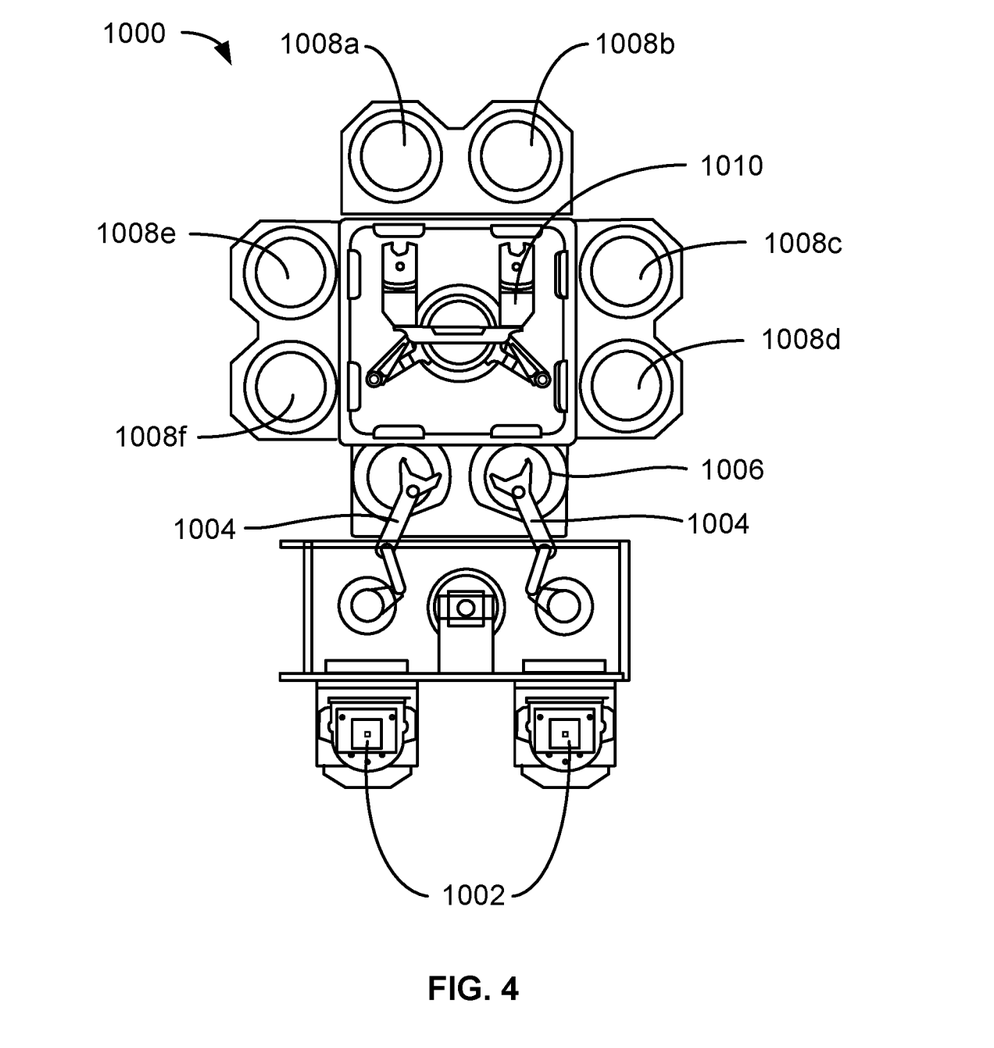
FIG. 4 shows a substrate processing system according to embodiments of the invention.
Figure 5:
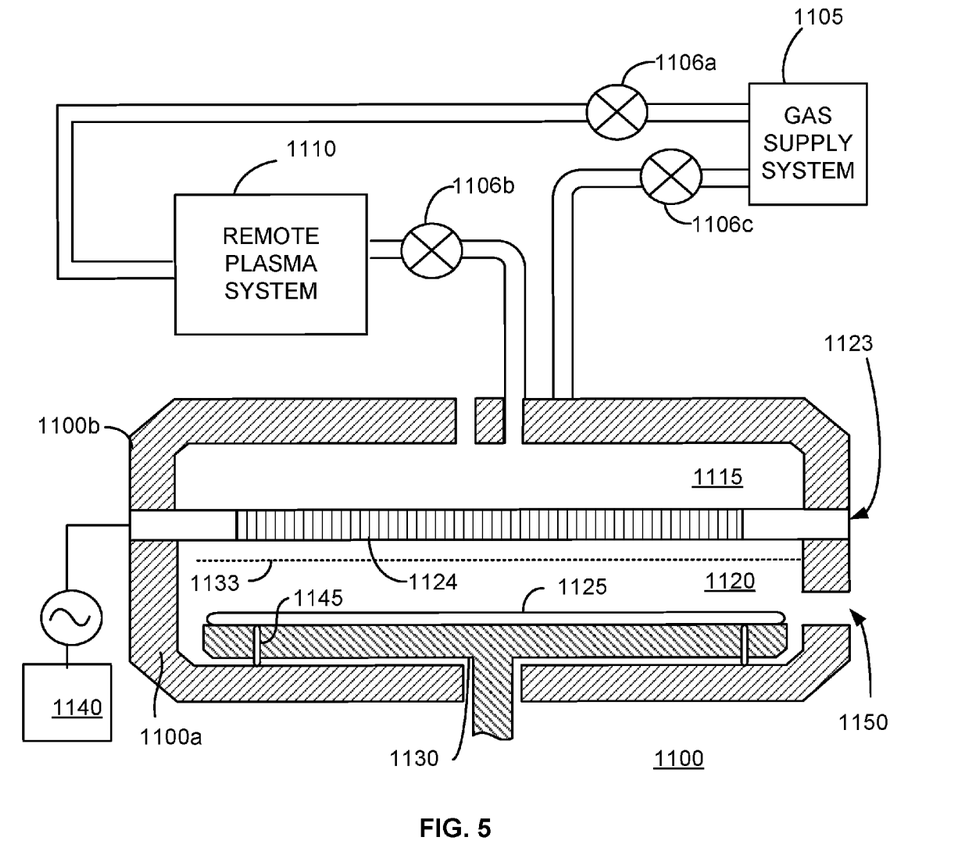
FIG. 5 shows a substrate processing chamber according to embodiments of the invention.

Embodiments of the methods described herein may be performed using substrate processing systems as shown in the example of FIG. 4 and using substrate processing chambers as shown in the example of FIG. 5. Substrate processing chambers may be incorporated into substrate processing systems for producing integrated circuit chips. FIG. 4 shows one such substrate processing system 1000 of deposition, baking and curing chambers according to disclosed embodiments. A pair of FOUPs (front opening unified pods) 1002 supply substrate substrates (e.g., 300 mm diameter wafers) that are received by robotic arms 1004 and placed into a low pressure holding area 1006 before being placed into one of the substrate processing chambers 1008a-f. A second robotic arm 1010 may be used to transport substrates from the holding area 1006 to the processing chambers 1008a-f and back.

The substrate processing chambers 1008a-f may include one or more system components for depositing, annealing, curing and/or etching a planar amorphous carbon film on the substrate. In one configuration, two pairs of the processing chamber (e.g., 1008c-d and 1008e-f) may be used to deposit amorphous carbon material on the substrate using a local plasma as described herein, and the third pair of processing chambers (e.g., 1008a-b) may be used to treat the deposited material. In another configuration, the same two pairs of substrate processing chambers (e.g., 1008c-d and 1008e-f) may be configured to both deposit and treat the material on the substrate, while the third pair of chambers (e.g., 1008a-b) may be used for UV or E-beam curing of the material. In still another configuration, all three pairs of chambers (e.g., 1008a-f) may be configured to deposit and treat the material on the substrate. Any one or more of the processes described may be carried out on chamber(s) separated from the fabrication system shown according to embodiments.

Referring now to FIG. 5, a vertical cross-sectional view of a substrate processing chamber 1100 is shown and includes a chamber body 1100a and a chamber lid 1100b. Substrate processing chamber 1 contains a gas supply system 1105 which may provide several precursors through chamber lid 1100b into upper chamber region 1115. The precursors disperse within upper chamber region 1115 and may be evenly introduced into substrate processing region 1120 through blocker plate assembly 1123. During substrate processing, substrate processing region 1120 houses substrate 1125 which has been transferred onto substrate support pedestal 1130. Support pedestal 1130 may provide heat to substrate 1125 during processing to facilitate a deposition reaction.

The bottom surface of blocker plate assembly 1123 may be formed from an electrically conducting material in order to serve as an electrode for forming a capacitive plasma and may be used to form a plasma according to embodiments. During processing, the substrate (e.g. a semiconductor wafer) is positioned on a flat (or perhaps slightly convex) surface of the pedestal 1130. Substrate support pedestal 1130 can be moved controllably between a lower loading/off-loading position (depicted in FIG. 5) and an upper processing position (indicated by dashed line 1133). The separation between the dashed line and the bottom surface of blocker plate assembly 1123 is a parameter which helps control the plasma power density during processing. A lift mechanism and motor raises and lowers the support pedestal 1130 and its wafer lift pins 1145 as wafers are transferred into and out of substrate processing region 1120 by a robot blade (not shown) through an insertion/removal opening 1150 in the side of chamber body 1100a. The motor raises and lowers support pedestal 1130 between processing position 1133 and the lower wafer-loading position shown.

Before entering upper chamber region 1115, deposition and carrier gases are flowed from gas supply system 1105 through combined or separate delivery lines. The supply line for each process gas may include (i) safety shut-off valves 1106 that can be used to automatically or manually shut-off the flow a process gas into the chamber, and (ii) mass flow controllers (not shown) that may measure and control the flow of gas through the supply line. Some gases may flow through a remote plasma system (RPS) 1110 prior to entry into upper chamber region 1115.

After flowing into and through upper chamber region 1115, deposition and carrier gases are introduced into substrate processing region 1120 through through-holes in perforated circular gas distribution faceplate 1124 which forms the lower portion of blocker plate assembly 1123. Blocker plate assembly 1123 may also include a perforated blocker plate in order to increase the evenness of the distribution of precursors into substrate processing region 1120.

The deposition process performed in substrate processing chamber 1100 may be a plasma-enhanced process and may therefore be referred to as plasma-enhanced chemical vapor deposition (PECVD). In a plasma-enhanced process, an RF power supply 1140 may apply electrical power between gas distribution faceplate 1124 and support pedestal 1130 to excite the process gas mixture to form a plasma within the cylindrical region between gas distribution faceplate 1124 and substrate 1125 supported by support pedestal 1130. Gas distribution faceplate 1124 may have a conducting surface and/or may have a metal insert. In FIG. 5, the metal portion of gas distribution faceplate 1124 is electrically isolated from the rest of substrate processing chamber 1100 via dielectric inserts. This electrical isolation enables the voltage of faceplate 1124 to be varied with respect to, especially, support pedestal 1130 to apply the plasma power.

Flowing precursors into upper chamber region 1115 and subsequently into substrate processing region 1120 in conjunction with applying RF power between faceplate 1124 and support pedestal 1130 creates a plasma between faceplate 1124 and substrate 1125. The plasma produces plasma effluents which react to deposit a desired film on the surface of the semiconductor wafer supported on pedestal 1130. RF power supply 1140 may be a mixed frequency RF power supply that typically supplies power at a high RF frequency (RF1) of 13.56 MHz and a low RF frequency (RF2) of 360 kHz to enhance the decomposition of reactive species introduced into substrate processing region 1120. The desired film is then deposited on the surface of the semiconductor wafer supported on support pedestal 1130. Support pedestal 1130 may be resistively heated to provide thermal energy to substrate 1125 to assist with the reaction.

During a plasma-enhanced deposition process, the plasma may heat up process chamber 1100, including the walls of the chamber body 1100a surrounding an exhaust passageway (not shown) used to exhaust gases from substrate processing chamber 1100. When the plasma is off, a hot fluid may be circulated through the walls of substrate processing chamber 1100 to maintain the chamber at an elevated temperature. Preheating the walls of the substrate processing chamber 1100 to approximately the temperature during plasma processing may allow films to begin near their steady-state deposition rate, density, porosity and other film properties. Channels (not shown) may be provided within the chamber walls of substrate processing chamber 1100 for the hot fluid flow. Fluids used to heat the chamber body 1100a and possibly chamber lid 1100b may include water-based ethylene glycol or oil-based thermal transfer fluids in embodiments. Chamber heating can reduce condensation of reactant products which otherwise might migrate back into the processing chamber and adversely affect a deposition in process or a subsequent deposition. The remainder of the gas mixture that is not deposited in a layer, including reaction byproducts, is evacuated from substrate processing chamber 1100 by a vacuum pump through an orifice (not shown) in chamber body 1100a.

Support pedestal 1130 may be made of aluminum, anodized aluminum, ceramic, or a combination in embodiments. The wafer support platter of support pedestal 1130 may be resistively heated using an embedded single-loop embedded heater element configured to make multiple turns in the form of parallel concentric circles. An outer portion of the heater element may run adjacent to a perimeter of the support platter, while an inner portion may run along a path of a concentric circle having a smaller radius. The wiring to the heater element may pass through the stem of support pedestal 1100. Some, any or all of the chamber lining, gas inlet manifold faceplate, and various other reactor hardware are made out of material such as aluminum, anodized aluminum, or ceramic.

A remote plasma system 1110 may be mounted on chamber lid 1100b of substrate processing chamber 1100. Remote plasma system 1110 may be mounted on chamber lid 1100b. The plasma may dissociate a process gas including a fluorine-containing gas such as $NF_3$ and a carrier gas such as argon to generate free fluorine which is used to clean film deposits in substrate processing chamber 1100 such as on interior surfaces during preventative maintenance procedures.

The substrate processing system is controlled by a system controller. In an exemplary embodiment, the system controller includes storage media and processors (e.g. general purpose microprocessors or application specific IC's). The processors may be processor cores present on a monolithic integrated circuit, separated but still located on a single-board computer (SBC) or located on separate printed circuit cards possibly located at different locations about the substrate processing system. The processors communicate with one another as well as with analog and digital input/output boards, interface boards and stepper motor controller boards using standard communication protocols. The system controller controls all of the activities of the CVD machine. The system controller executes system control software, which is a computer program stored in a computer-readable medium. The computer program includes sets of instructions that dictate the timing, mixture of gases, chamber pressure, chamber and substrate temperatures, RF power levels, support pedestal position, and other parameters of a particular process.

In the preceding description, for the purposes of explanation, numerous details have been set forth to provide an understanding of embodiments of the subject matter described herein. It will be apparent to one skilled in the art, however, that certain embodiments may be practiced without some of these details, or with additional details.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. "Silicon" or "polysilicon" of the patterned substrate is predominantly Si but may include minority concentrations of other elemental constituents such as nitrogen, oxygen, hydrogen and carbon. "Silicon" or "polysilicon" may consist of or consist essentially of silicon. Exposed "silicon nitride" of the patterned substrate is predominantly silicon and nitrogen but may include minority concentrations of other elemental constituents such as oxygen, hydrogen and carbon. "Silicon nitride" may consist essentially of or consist of silicon and nitrogen. "Silicon oxide" of the patterned substrate is predominantly $SiO_2$ but may include minority concentrations of other elemental constituents such as nitrogen, hydrogen and carbon. In embodiments, silicon oxide films consist essentially of or consist of silicon and oxygen. Analogous definitions will be understood for other elements or compounds including metals such as tungsten.

The amorphous carbon layer may include about 79% carbon, 20% hydrogen and 1% nitrogen or may contain 75-83% carbon, 18%-22% hydrogen and 0.3-2% nitrogen in embodiments. The amorphous carbon layer may include about 75% carbon, 18% hydrogen and 7% nitrogen or may contain 71-79% carbon, 16%-20% hydrogen and 2-12% nitrogen according to embodiments.

The term "precursor" is used to refer to any process gas which takes part in a reaction to either remove material from or deposit material onto a surface. The phrase "inert gas"

refers to any gas which does not form chemical bonds when etching or being incorporated into a film. Exemplary inert gases include noble gases but may include other gases so long as no chemical bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the embodiments described herein. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments described, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of forming a carbon layer on a patterned substrate, the method comprising:
    placing the patterned substrate in a substrate processing region of a substrate processing chamber;
    flowing a hydrogen-containing precursor into the substrate processing region;
    flowing a hydrocarbon precursor into the substrate processing region;
    applying plasma power to the substrate processing region;
    forming a plasma from a combination of the hydrogen-containing precursor and the hydrocarbon precursor in the substrate processing region, wherein the hydrogen-containing precursor comprises hydrogen, and wherein the hydrocarbon precursor comprises between one and four carbon atoms;
    maintaining a first atomic flow rate ratio (H:C) between zero and two, wherein the first atomic flow rate ratio includes hydrogen from both the hydrogen-containing precursor and the hydrocarbon precursor and includes any carbon from the hydrogen-containing precursor and the hydrocarbon precursor;
    forming a first portion of a carbon layer having a first top interface;
    increasing an atomic flow rate ratio from the first atomic flow rate ratio to a second atomic flow rate ratio (H:C) greater than two;
    maintaining the second atomic flow rate ratio, wherein the second atomic flow rate ratio includes hydrogen from both the hydrogen-containing precursor and the hydrocarbon precursor and includes any carbon from the hydrogen-containing precursor and the hydrocarbon precursor; and
    forming a second portion of the carbon layer having a second top interface.

2. The method of forming a planar layer on a patterned substrate of claim 1 wherein the second atomic flow rate ratio (H:C) is greater than three.

3. The method of forming a planar layer on a patterned substrate of claim 1 wherein the second top interface is more planar than the first top interface.

4. The method of forming a planar layer on a patterned substrate of claim 1 wherein forming the plasma comprises applying an RF power capacitively.

5. The method of forming a planar layer on a patterned substrate of claim 1 wherein the hydrogen-containing precursor further comprises nitrogen.

6. The method of forming a planar layer on a patterned substrate of claim 1 wherein forming the plasma comprises applying an RF power at a frequency greater than 100 kHz.

7. The method of forming a carbon layer on a patterned substrate of claim 1 wherein the hydrocarbon precursor comprises at least one member of the group consisting of $C_2H_2$, $C_2H_4$, $C_3H_6$ or $C_3H_4$.

8. The method of forming a carbon layer on a patterned substrate of claim 1 wherein the hydrogen-containing precursor consists of hydrogen or consists of hydrogen and nitrogen.

9. A method of forming a planar carbon layer on a patterned substrate, the method comprising:
    placing the patterned substrate in a substrate processing region of a substrate processing chamber;
    flowing a hydrogen-containing precursor into the substrate processing region;
    flowing a hydrocarbon precursor into the substrate processing region, wherein the hydrocarbon precursor comprises carbon and hydrogen, and wherein the hydrocarbon precursor comprises between one and four carbon atoms;
    forming a precursor combination of the hydrogen-containing precursor and the hydrocarbon precursor in the substrate processing region;
    applying plasma power to the precursor combination in the substrate processing region;
    continuously increasing an atomic flow rate ratio from a first atomic flow rate ratio (H:C) below two to a second atomic flow rate ratio (H:C) above three, wherein the first atomic flow rate ratio includes hydrogen from both the hydrogen-containing precursor and the hydrocarbon precursor and includes any carbon from the hydrogen-containing precursor and the hydrocarbon precursor, and wherein the second atomic flow rate ratio includes hydrogen from both the hydrogen-containing precursor and the hydrocarbon precursor and includes any carbon from the hydrogen-containing precursor and the hydrocarbon precursor; and
    forming a planar carbon layer.

10. The method of forming a planar carbon layer on a patterned substrate of claim 9 wherein the second atomic flow rate ratio is between three and seven.

11. The method of forming a planar carbon layer on a patterned substrate of claim 9 wherein the hydrogen-containing precursor comprises at least one member of the group consisting of $H_2$, $NH_3$, $N_2H_4$ and $N_2H_2$.

12. The method of forming a planar carbon layer on a patterned substrate of claim 9 wherein the hydrocarbon precursor consists of carbon and hydrogen.

13. The method of forming a planar carbon layer on a patterned substrate of claim 9 wherein the hydrocarbon precursor comprises at least one member of the group consisting of $C_2H_2$, $C_2H_4$, $C_3H_6$ or $C_3H_4$.

14. The method of forming a planar carbon layer on a patterned substrate of claim 9 wherein the hydrogen-containing precursor consists of hydrogen or consists of hydrogen and nitrogen.

\* \* \* \* \*